United States Patent
Hsu et al.

(10) Patent No.: US 7,444,255 B2
(45) Date of Patent: Oct. 28, 2008

(54) SYSTEM AND METHOD FOR ANALYZING LENGTHS OF BRANCHES OF SIGNAL PATHS

(75) Inventors: Shou-Kuo Hsu, Taipei Hsien (TW); Chia-Nan Pai, Taipei Hsien (TW); Cheng-Shien Li, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 6 days.

(21) Appl. No.: 11/768,922

(22) Filed: Jun. 27, 2007

(65) Prior Publication Data

US 2008/0040054 A1    Feb. 14, 2008

(30) Foreign Application Priority Data

Aug. 9, 2006   (CN)   .......................... 2006 1 0062039

(51) Int. Cl.
    *G01R 27/28*   (2006.01)
(52) U.S. Cl. ......................................... 702/117; 702/97
(58) Field of Classification Search .................. 702/97, 702/117, 118; 716/12, 13, 14, 15
    See application file for complete search history.

(56) References Cited

U.S. PATENT DOCUMENTS

| 6,700,113 | B1 |   | 3/2004 | Rhy et al. |
| 7,240,310 | B2 | * | 7/2007 | Cook et al. ..................... 716/5 |

* cited by examiner

*Primary Examiner*—John E. Barlow
*Assistant Examiner*—Stephen J Cherry
(74) *Attorney, Agent, or Firm*—Frank R. Niranjan

(57) ABSTRACT

A system for analyzing lengths of branches of signal paths is disclosed. The system includes: a signal path naming module for naming all signal paths of a PCB; a signal path group selecting module for selecting a group of signal paths to be analyzed from the database; a signal path selecting module for selecting signal paths to be analyzed from the group of signal paths; a branch searching module for analyzing the selected signal paths, to search passive circuit components and external circuits connected to the selected signal paths for corresponding branches of the selected signal paths; a branch length calculating module for calculating a length of each branch; and a branch length comparing module for comparing each calculated branch length with a corresponding predefined maximal branch length to determine whether the calculated branch length is more than the predefined maximal branch length. A related method is also disclosed.

7 Claims, 3 Drawing Sheets

SYSTEM AND METHOD FOR ANALYZING LENGTHS OF BRANCHES OF SIGNAL PATHS

BACKGROUND OF THE INVENTION

1. Field of the Invention

The present invention relates to a system and method for analyzing lengths of branches of signal paths.

2. Description of Related Art

With the continuing technology advancement of computer systems, signals transmitted between components of the computer systems are essential. When the signals are transmitted from a transmission port to a receiver in a printed circuit board (PCB) of a computer, many passive circuit components are adopted for connecting an external circuit to divide the voltage in a whole circuit so as to provide the whole circuit with constant voltage. The external circuit is a circuit that is connected to the PCB and out of the PCB. The passive components, such as resistors and capacitors, are generally two-terminal devices that have no external power source.

When utilizing the passive circuit components to divide the voltage, positions of the passive circuit components and wiring of the signal paths result in branches of the signal paths. Generally speaking, length of the branches should be limited to prevent excess resistance that would influence integrity of signals during transmitting.

Therefore, what is needed is a system and method for analyzing lengths of branches of signal paths, by which users can analyze lengths of branches of signal paths and prevent influencing signals' integrity.

SUMMARY OF THE INVENTION

A system for analyzing lengths of branches of signal paths according to a preferred embodiment is provided. The system includes: a signal path naming module programmed for naming all signal paths of a printed circuit board (PCB), and storing the naming information into a database; a signal path group selecting module programmed for selecting a group of signal paths to be analyzed from the database according to the naming information; a signal path selecting module programmed for selecting signal paths to be analyzed from the group of signal paths; a branch searching module programmed for analyzing the selected signal paths, to search passive circuit components and external circuits connected to the selected signal paths for corresponding branches of the selected signal paths; a branch length calculating module programmed for calculating a length of each branch; and a branch length comparing module programmed for comparing each calculated branch length with a corresponding predefined maximal branch length that is stored in the database, and determining whether the calculated branch length is more than the predefined maximal branch length.

A preferred method for analyzing lengths of branches of signal paths includes the steps of: (a) naming all signal paths of a printed circuit board (PCB) and storing the naming information into a database; (b) selecting a group of signal paths to be analyzed from the database according to the naming information; (c) selecting signal paths to be analyzed from the group of signal paths; (d) analyzing the selected signal paths to search passive circuit components and external circuits connected to the selected signal paths for corresponding branches of the selected signal paths; (e) calculating a length of each branch; (f) comparing the calculated branch length with a corresponding predefined maximal branch length that is stored in the database; and (g) determining whether the calculated branch length is more than the predefined maximal branch length.

Other advantages and novel features of the embodiments will be drawn from the following detailed description with reference to the attached drawings.

DETAILED DESCRIPTION OF THE INVENTION

Figure 1:
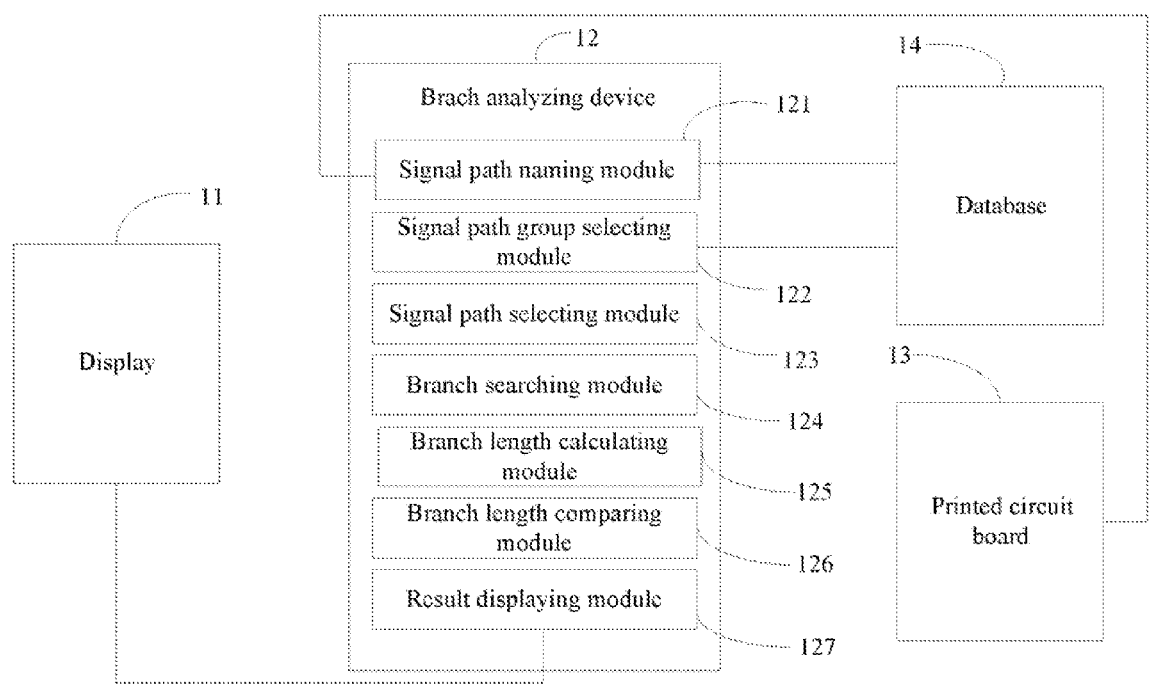
FIG. 1 is a schematic diagram of hardware configuration of a system for analyzing lengths of branches of signal paths in accordance with a preferred embodiment.

FIG. 1 is a schematic diagram of hardware configuration of a system for analyzing lengths of branches of signal paths (hereinafter, "the system") in accordance with a preferred embodiment. The system includes: a display 11, a branch analyzing device 12, a printed circuit board (PCB) 13, and a database 14.

Typically, the branch analyzing device 12 includes a signal path naming module 121, a signal path group selecting module 122, a signal path selecting module 123, a branch searching module 124, a branch length calculating module 125, a branch length comparing module 126, and a result displaying module 127.

Figure 2:
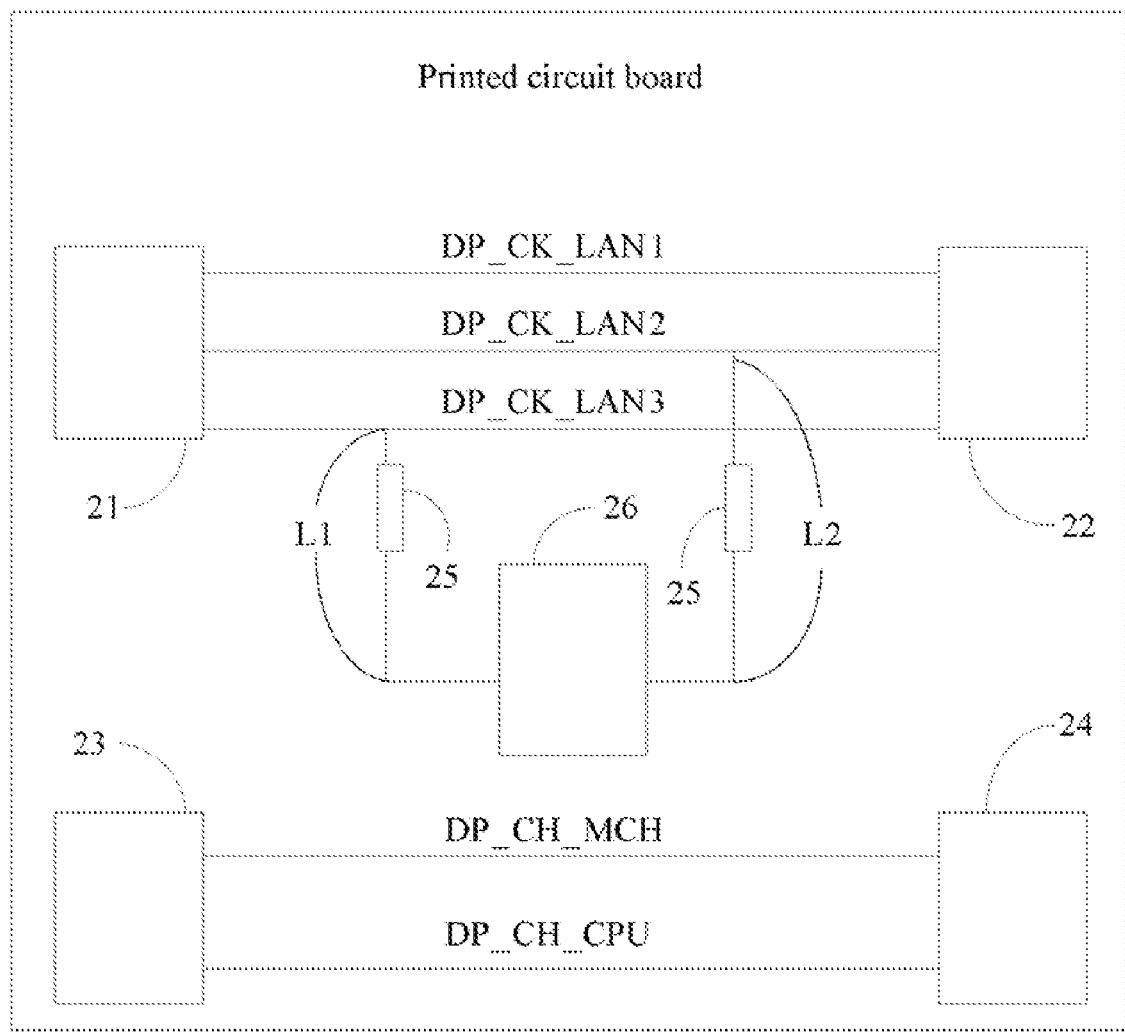
FIG. 2 is a schematic diagram of a printed circuit board (PCB) of FIG. 1.

The signal path naming module 121 is programmed for assigning a unique name to each signal path of the PCB 13, and storing the naming information of all the signal paths into the database 14. FIG. 2 is a schematic diagram of the PCB 13. The PCB 13 includes: a first signal transmitter 21, a first signal receiver 22, a second signal transmitter 23, a second signal receiver 24, two passive circuit components 25 (i.e., two capacitances, two resistances, or the like), and an external circuit 26. When the branch analyzing device 12 analyzes the PCB 13, the signal path naming module 121 names all signal paths of the PCB 13 according to a predefined naming rule. For example, the naming rule may be predefined to number the signal paths according to types or functions of the signal paths. Referring to FIG. 2, there are three signal paths named as DP_CK_LAN1, DP_CK_LAN2, and DP_CK_LAN3 from the first signal transmitter 21 to the first signal receiver 22, and there are two signal paths named as DP_CH_MCH and DP_CH_CPU from the second signal transmitter 23 to the second signal receiver 24.

The signal path group selecting module 122 is programmed for selecting a group of signal paths to be analyzed from the database 14 according to the numbering rule. Different PCBs may perform different functions. Furthermore, certain functions cannot be realized via a single signal path, but often via a plurality of signal paths in a certain area of a PCB. I.e., a central processing unit (CPU) and a memory can be built on a motherboard of a computer, the CPU may have a group of signal paths, and the memory may have another group of signal paths. Each group of signal paths corresponds to a special function. According to FIG. 2, the first group of signal paths DP_CK_LAN1, DP_CK_LAN2, and DP_CK_LAN3 and the second group of signal paths DP_CH_MCH and DP_CH_CPU are configured for transmitting signals from the first signal transmitter 21 to the first signal receiver 22, from the second signal transmitter 23 to the second signal receiver 24 respectively.

The signal path selecting module 123 is programmed for selecting signal paths from the group of signal paths. As mentioned above, if lengths of branches of signal paths named as DP_CK_LAN2 and DP_CK_LAN3 need to be analyzed, the signal path group selecting module 122 first selects the group of signal paths with names that begin with DP_CK from the database 14, then, the signal path named DP_CK_LAN2 and DP_CK_LAN3 is selected via the signal path selecting module 123.

The branch searching module 124 is programmed for analyzing the selected signal paths, to search passive circuit components and external circuits connected to the selected signal paths for a corresponding branch of the selected signal paths. I.e., referring to FIG. 2, the selected signal paths named as DP_CK_LAN2 and DP_CK_LAN3 are connected to the external circuit 26 and the passive circuit components 25, the branch searching module 124 searches for a branch L1 corresponding to the DP_CK_LAN3, and a branch L2 corresponding to the DP_CK_LAN2. If a selected signal path is not connected with any passive circuit components and external circuits, the branch searching module 124 does not search for a branch of the selected signal path, i.e., the signal paths that are named as DP_CH_MCH and DP_CH_CPU.

The branch length calculating module 125 is programmed for calculating a length of each of the branches. I.e., the branch length calculating module 125 calculates a length of L1 and a length of L2.

The branch length comparing module 126 is programmed for comparing the calculated branch length with a corresponding maximal branch length that is stored in the database 14, and determining whether the calculated branch length is more than the maximal branch length. The maximal branch length is a maximal allowable length of the branch that would not influence signal's integrity. The signal's integrity means that the signal is transferred from a transmitter to a receiver integrally. I.e., In the course of transmitting the signal, there is a maximal resistance that can influence the signal's integrity. According to the maximal resistance and electric conduction capability of the transmitting paths, a maximal allowable length of the transmitting paths can be calculated. For example, according to a maximal resistance and electric conduction capability of the branch L1, a maximal branch length of the branch L1 can be calculated. After the branch length calculating module 125 calculates the branch length of L1, the branch length comparing module 126 compares the length of L1 with the maximal branch length of L1.

The branch length comparing module 126 is further configured for determining whether the branch is qualified. If the calculated branch length is less than or equal to the corresponding maximal branch length, the branch is qualified; if the calculated branch length is more than the corresponding maximal branch length, the branch is not qualified.

The result displaying module 127 is programmed for displaying the calculating result on the display 11, such as the calculated branch length of L1 and L2. Furthermore, the result displaying module 127 is programmed for displaying an indicating message to alert users that the branch is qualified or not qualified.

Figure 3:
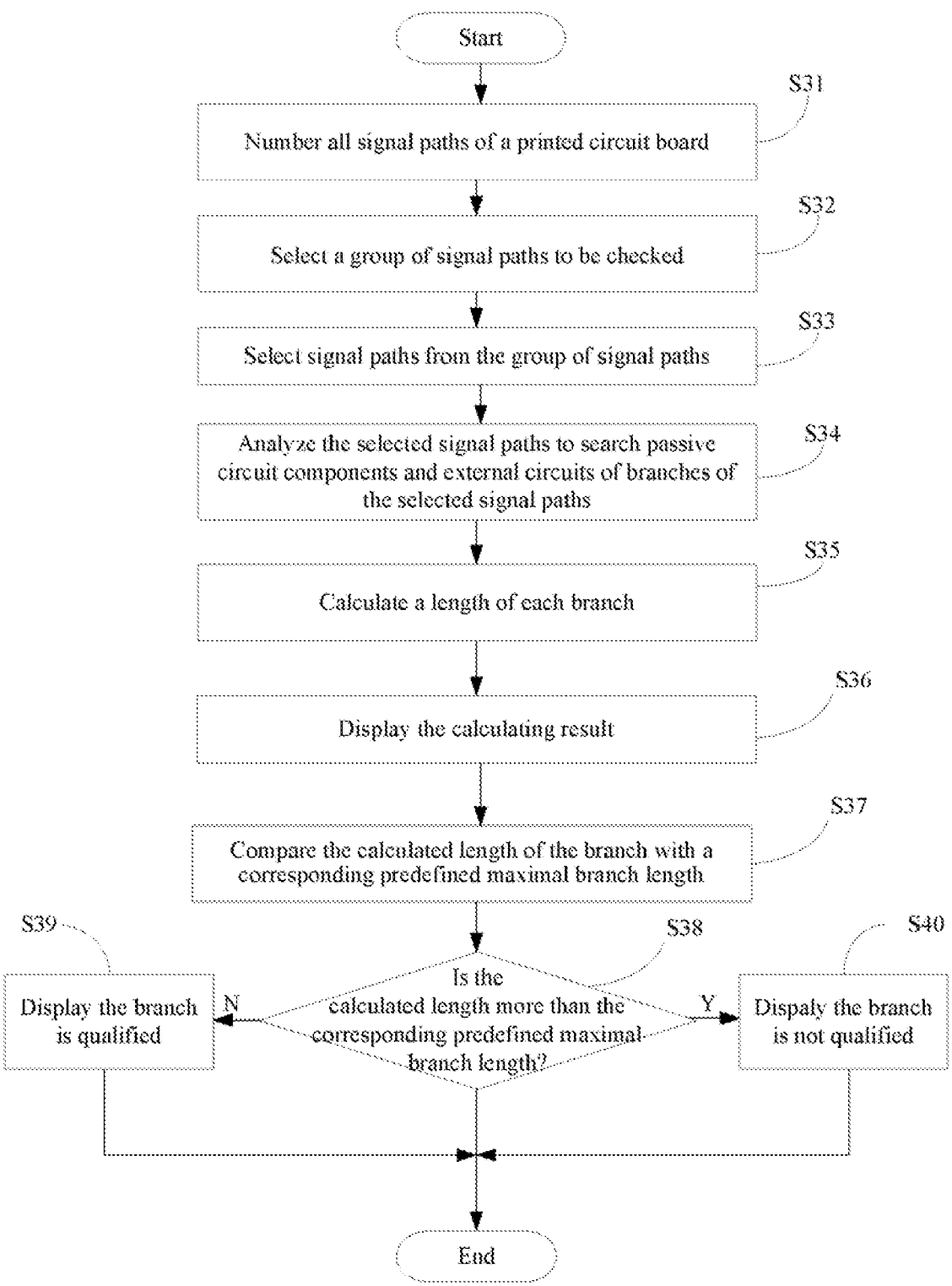
FIG. 3 is a flowchart of a preferred method for analyzing lengths of branches of signal paths by utilizing the system of FIG. 1.

FIG. 3 is a flowchart of a preferred method for analyzing lengths of branches of signal paths by utilizing the system of FIG. 1. In step S31, the signal path naming module 121 names all of the signal paths of the PCB 13 according to a predefined naming rule, and stores the naming information of all the signal paths into the database 14. For example, the naming rule may be predefined to number the signal paths according to types or functions of the signal paths. Referring to FIG. 2, there are three signal paths named as DP_CK_LAN1, DP_CK_LAN2, and DP_CK_LAN3 from the first signal transmitter 21 to the first signal receiver 22, and two signal paths named as DP_CH_MCH and DP_CH_CPU from the second signal transmitter 23 to the second signal receiver 24.

In step S32, the signal path group selecting module 122 selects a group of signal paths to be analyzed from the database 14 according to the names, such as the group of signal paths with names that begin with DP_CK (DP_CK_LAN1, DP_CK_LAN2, and DP_CK_LAN3).

In step S33, the signal path selecting module 123 selects signal paths to be analyzed from the group of signal paths, such as DP_CK_LAN2, and DP_CK_LAN3 from the group of signal paths named as DP_CK_*.

In step S34, the branch searching module 124 analyzes the selected signal path, to searches for passive circuit components and external circuits connected to the selected signal paths to find out branches of the selected signal paths. Seen in FIG. 2, passive circuit components 25 and 26 connected to the signal path DP_CK_LAN3 and DP_CK_LAN2 would be searched by the branch searching module 124, correspondingly, branches L1 and L2 are found out.

In step S35, the branch length calculating module 125 calculates a length of each branch, such as a length of L1 and a length of L2.

In step S36, the result displaying module 127 displays the calculated results on the display 11, such as the length of L1 and the length of L2.

In step S37, the branch length comparing module 126 compares each calculated length of the branch with a corresponding predefined maximal branch length that is stored in the database 14.

In step S38, the branch length comparing module 126 determines whether the calculated length is more than the corresponding predefined maximal branch length. The maximal branch length is maximal allowable length of the branch that that would not influence signal's integrity. The signal's integrity means that the signal is transferred from a transmitter to a receiver integrally.

In step S38, if the calculated branch length is less than or equal to the corresponding predefined maximal branch length, the procedure goes to step S39, the result displaying module 127 displays an indication message to alert users that the branch is qualified. Otherwise, if the calculated branch length is more than the corresponding predefined maximal branch length, the procedure goes to step S40, the result displaying module 127 displays an indication message to alert users that the branch is not qualified.

Other signal paths of the PCB 13 can be analyzed by repeating the above steps from step S32 to step S310.

Although the present invention has been specifically described on the basis of a preferred embodiment and preferred method, the invention is not to be construed as being limited thereto. Various changes or modifications may be made to the embodiment and method without departing from the scope and spirit of the invention.

What is claimed is:

1. A system for analyzing lengths of branches of signal paths, the system comprising:

a signal path naming module programmed for naming all signal paths of a printed circuit board (PCB), and storing the naming information into a database;

a signal path group selecting module programmed for selecting a group of signal paths to be analyzed from the database according to the naming information;

a signal path selecting module programmed for selecting signal paths to be analyzed from the group of signal paths;

a branch searching module programmed for analyzing the selected signal paths, to search passive circuit components and external circuits connected to the selected signal paths for corresponding branches of the selected signal paths;

a branch length calculating module programmed for calculating a length of each branch; and a branch length comparing module programmed for comparing each calculated branch length with a corresponding predefined maximal branch length that is stored in the database, and determining whether the calculated branch length is more than the predefined maximal branch length.

2. The system according to claim 1, further comprising:

a result displaying module programmed for displaying the calculating result on a display.

3. The system according to claim 2, wherein the result displaying module is further configured for displaying an indicating message to alert users that the branch is qualified if the calculated branch length is less than or equal to the predefined maximal branch length, or displaying an indicating message to alert users that the branch is not qualified if the calculated branch length is more than the predefined maximal branch length.

4. The system according to claim 1, wherein the maximal branch length is a wired maximal length of the branch that would not influence signal's integrity.

5. A computer-based method for analyzing lengths of branches of signal paths, the method comprising the steps of:

naming all signal paths of a printed circuit board (PCB) and storing the naming information into a database;

selecting a group of signal paths to be analyzed from the database according to the naming information;

selecting signal paths to be analyzed from the group of signal paths;

analyzing the selected signal paths to search passive circuit components and external circuits connected to the selected signal paths for corresponding branches of the selected signal paths;

calculating a length of each branch;

comparing the calculated branch length with a corresponding predefined maximal branch length that is stored in the database; and determining whether the calculated branch length is more than the predefined maximal branch length.

6. The method according to claim 5, further comprising a step of:

displaying the calculating result on a display.

7. The method according to claim 5, further comprising a step of:

display an indicating message to alert users that the branch is qualified on the display if the calculated branch length is less than or equal to the predefined maximal branch length, or display an indicating message to alert users that the branch is not qualified if the calculated branch length is more than the predefined maximal branch length.

* * * * *